(12) United States Patent
Huber et al.

(10) Patent No.: US 10,048,114 B2
(45) Date of Patent: Aug. 14, 2018

(54) DEVICE FOR MEASURING THE VIBRATIONAL AMPLITUDE OF A CAPILLARY TUBE OF A WIRE BONDER

(71) Applicant: DR. JOHANNES HEIDENHAIN GmbH, Traunreut (DE)

(72) Inventors: Walter Huber, Traunstein (DE); Wolfgang Holzapfel, Obing (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 41 days.

(21) Appl. No.: 15/124,159

(22) PCT Filed: Dec. 10, 2014

(86) PCT No.: PCT/EP2014/077195
§ 371 (c)(1),
(2) Date: Sep. 7, 2016

(87) PCT Pub. No.: WO2015/131968
PCT Pub. Date: Sep. 11, 2015

(65) Prior Publication Data
US 2017/0016760 A1 Jan. 19, 2017

(30) Foreign Application Priority Data
Mar. 7, 2014 (DE) .................. 10 2014 204 205

(51) Int. Cl.
*G01H 9/00* (2006.01)
*B06B 3/02* (2006.01)

(52) U.S. Cl.
CPC .............. *G01H 9/00* (2013.01); *B06B 3/02* (2013.01)

(58) Field of Classification Search
CPC ....................... G01H 9/00; B06B 3/02
See application file for complete search history.

(56) References Cited

U.S. PATENT DOCUMENTS 5,291,884 A * 3/1994 Heinemann ........ A61B 5/14535
600/322
5,431,324 A 7/1995 Kajiwara et al.
(Continued)

FOREIGN PATENT DOCUMENTS

| DE | 103 09 694 | 9/2003 |
|---|---|---|
| EP | 1 340 582 | 9/2003 |
| JP | H 10-209199 | 8/1998 |

OTHER PUBLICATIONS

International Search Report issued in PCT/EP2014/077195, dated Jun. 5, 2015.

*Primary Examiner* — Paul West
*Assistant Examiner* — Xin Zhong
(74) *Attorney, Agent, or Firm* — Hunton Andrews Kurth LLP (57) ABSTRACT

In a device for measuring the vibrational amplitude of a capillary tube of a wire bonder, the capillary tube is placed between a light source and a detector system, so that the vibrational amplitude is able to be ascertained from the shading of a beam of light by the capillary tube. The beam of light emitted by the light source is split into a measuring beam of light and a reference beam of light, an edge of the capillary tube at least partially shading the measuring beam of light in the vibrating state, while the reference beam of light is not shaded. The detector system includes a measuring detector assigned to the measuring beam of light as well as at least one reference detector assigned to the reference beam of light, and the vibrational amplitude of the capillary tube is ascertainable from the interconnected output signals of the measuring detector and the reference detector.

8 Claims, 4 Drawing Sheets

(56) References Cited

U.S. PATENT DOCUMENTS

| | | |
|---|---|---|
| 6,827,247 B1 | 12/2004 | Fan et al. |
| 2003/0159514 A1* | 8/2003 | Hess .................... B06B 3/02 |
| | | 73/579 |
| 2005/0237533 A1* | 10/2005 | Lal ...................... G01H 9/00 |
| | | 356/486 |
| 2012/0067118 A1* | 3/2012 | Hartog .................. E21B 41/00 |
| | | 73/152.16 |

* cited by examiner

Fig. 1

Related Art

DEVICE FOR MEASURING THE VIBRATIONAL AMPLITUDE OF A CAPILLARY TUBE OF A WIRE BONDER

FIELD OF THE INVENTION

The present invention relates to a device for measuring the vibrational amplitude of a capillary tube of a wire bonder.

BACKGROUND INFORMATION

Figure 1:
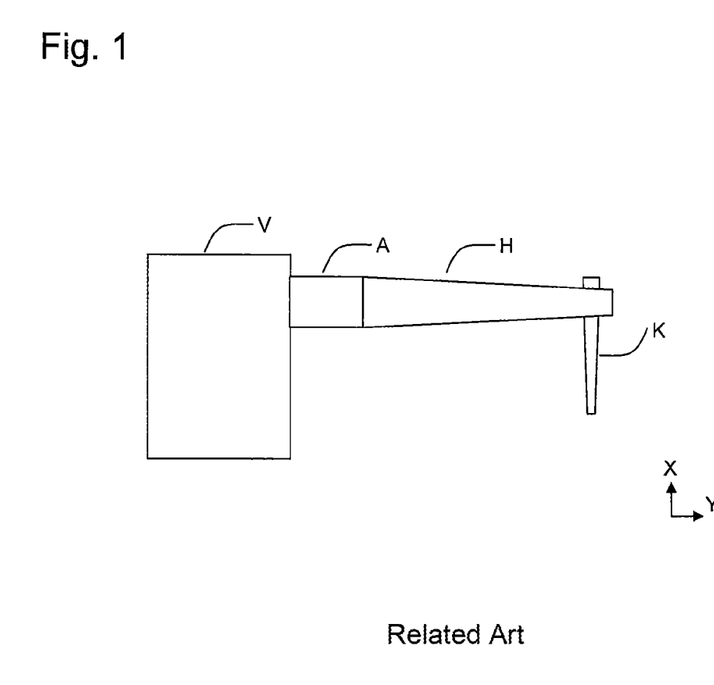
FIG. 1 schematically illustrates a conventional wire bonder.

A wire bonder is normally used for wiring or electrically contacting semiconductor components once they have been mounted on a carrier substrate. FIG. 1 schematically illustrates such a wire bonder. With the aid of a piezo actuator A, an axial ultrasonic wave having a frequency of approximately 100 kHz is generated in the wire bonder. An ultrasonic horn H transmits this ultrasonic wave to a capillary tube K, which thereby likewise vibrates at an amplitude of typically 1-10 µm mainly in axial direction Y of ultrasonic horn H (contactless state). Usual diameters of capillary tube K lie in a range between 60 µm and 150 µm. Capillary tube K, frequently made of ceramic material, has a small duct (not shown in the figure), through which the bonding wire is guided, which emerges from the tip of capillary tube K. The so-called bond head, which is made up of piezo actuator A, ultrasonic horn H, and capillary tube K, is often mounted on a slide unit V inside the wire bonder. Slide unit V is able to move the bond head in all three spatial directions X, Y, Z and thereby bring capillary tube K or the bonding wire to the individual sampling points.

The capillary tubes wear out with use, which is why they must be replaced on a regular basis. Because the different capillary tubes frequently have small mechanical tolerances, the capillary tube often has a slightly different vibrational amplitude after the exchange, and their clamping on the ultrasonic horn is not fully reproducible either. However, a different vibrational amplitude leads to fluctuating bond qualities in wire bonding. The time-consuming optimization of the bonding process using a first capillary tube that normally takes place can therefore be transferred to the subsequently used capillary tubes of the same type only to a very limited extent. In practice, this usually means that the probability of producing poor bond contacts, which constitute a high malfunction risk for the corresponding electronic device, is not negligible.

After each exchange of the capillary tube, the vibrational amplitude therefore is usually measured anew in the contactless state with the aid of a suitable device, and then brought back to the optimized value again by adapting the supply voltage of the piezo actuator. This makes it possible to increase the bond quality significantly.

To measure the vibrational amplitude of capillary tubes of a wire bonder, devices are known in which the capillary tube is situated between a light source and a detector system. In this case, the vibrational amplitude is able to be ascertained from the shading of a beam of light by the capillary tube. As far as devices based on a light barrier principle are concerned, reference is made to European Published Patent Application No. 1 340 582, U.S. Pat. No. 6,827,247 and Japanese Published Patent Application No. 10-209199, for example. In U.S. Pat. No. 6,827,247, the two edges of the capillary tube are sampled simultaneously and the vibrational amplitude ascertained from such sampling; in the devices described in European Published Patent Application No. 1 340 582 A1 and Japanese Published Patent Application No. 10-209199, only one edge of the capillary tube is sampled for this purpose.

In the devices described in the foregoing documents, the output signal generated at the detector system is modulated slightly by the ultrasonic movement of the capillary tube. Modulation amplitude $\Delta S_{AC}$ of the output signal has an approximately linear relation to vibrational amplitude $\Delta y_{AC}$ of the capillary tube, according to the following relationship:

$$\Delta S_{AC} = \eta \cdot \Delta y_{AC} \quad \text{(eq. 1)}$$

where:
$\Delta S_{AC}$:=the modulation amplitude of the output signal
$\Delta y_{AC}$:=the vibrational amplitude of the capillary tube
$\eta$:=the slope factor)

Slope factor $\eta$ is a function of the luminous power of the light source used as well as the size of the light source image on the capillary tube, and the amplification factor of the evaluation electronics. Slope factor $\eta$, which should be as constant as possible, therefore has to be calibrated. This requirement in particular must also apply with regard to the working temperature, since the temperature conditions inside a wire bonder are usually not constant; instead, depending on the capacity utilization of the machine and the process, considerable temperature fluctuations may sometimes occur in a working temperature range of 20° C. to 60° C. In conventional approaches, such temperature fluctuations also result in fluctuations in the luminous power emitted by the light source. For instance, at an assumed typical temperature coefficient of the luminous power of a light source of −0.3%/K and a temperature rise of 40K, the emitted luminous power is reduced by 12%. The aforementioned slope factor $\eta$ consequently changes by 12%, as well, which in turn leads to considerable errors in the determination of vibrational amplitude $\Delta y_{AC}$ of the capillary tube. It is for this reason that conventional devices for measuring the vibrational amplitude in wire bonders provide only limited accuracy.

Another problem of conventional devices is the noise of the generated output signal. In principle, such noise should be as low as possible. Very low noise values are necessary to be able to ascertain vibrational amplitudes $\Delta y_{AC}$ at the required high reproducibility. In the devices from the above-mentioned documents, the transmitted luminous power is measured with the aid of a photoelement in the detector system, which thus constitutes the output signal of the light barrier, which will then be amplified and digitized in addition. At the working point of the light barrier, with the capillary tube covering approximately one half of the light spot, small modulation amplitudes $\Delta S_{AC}$ must be ascertained at a high signal offset level $S_{DC}$ that corresponds to this halfway coverage. The amplifier thus has to be configured accordingly, so that it is able to amplify the high signal offset level S. In this case, the amplification factor must be selected so that offset level $S_{DC}$ does not lead to a saturation of the amplifier. Because of the correspondingly lower amplification, the amplifier is unable to be used in a noise-optimized manner. The noise levels of the devices for measuring the vibrational amplitude of capillary tubes in wire bonders described in the above-mentioned documents are therefore relatively high.

SUMMARY

Example embodiments of the present invention provide a device for measuring the vibrational amplitude of a capillary tube of a wire bonder that functions substantially without errors even when large temperature fluctuations are encountered. Moreover, the noise of the output signal generated by such a device should be as low as possible.

The device according to an example embodiment of the present invention is used for measuring the vibrational amplitude of a capillary tube of a wire bonder, the capillary tube being situated between a light source and a detector system. The vibrational amplitude is able to be ascertained from the shading of a beam of light by the capillary tube. The beam of light emitted by the light source is split into a measuring beam of light and a reference beam of light, an edge of the capillary tube at least partially shading the measuring beam of light in the vibrating state, while no shading occurs in the reference beam of light. The detector system includes a measuring detector allocated to the measuring beam of light as well as at least one reference detector allocated to the reference beam of light, and the vibrational amplitude of the capillary tube is ascertainable from the interconnected output signals of the measuring detector and the reference detector.

A first imaging optics may be post-connected to the light source in the light propagation direction, via which imaging of the light source in the measuring beam of light and in the reference beam of light takes place into an image plane in which the capillary tube is vibrating.

A second imaging optics, via which the measuring beam of light and the reference beam of light are focused into a detection plane or into a diaphragm plane, may be situated between the image plane and the detector system.

The first and/or the second imaging optics may include refractive or diffractive lenses in each case, which are situated in the measuring beam of light and in the reference beam of light.

It may furthermore be the case that the first imaging optics is arranged such that the diameter of the light source image in the image plane is smaller than two times the diameter of the capillary tube.

It is moreover possible that, adjacent to the detection plane or in the diaphragm plane, a diaphragm aperture is located in the measuring beam of light, downstream from which the measuring detector is disposed in the beam propagation direction, and a diaphragm aperture is located in the reference beam of light, downstream from which the at least one reference detector is disposed in the beam propagation direction.

The diaphragm apertures may have a diameter that lies in a range of one to three times the diameter of the focused measuring and reference beams of light.

It may furthermore be the case that the measuring detector and at least one reference detector are connected to each other in an antiparallel manner, so that a photocurrent-differential signal results at the output-side connections, which is able to be forwarded to a downstream transimpedance amplifier stage, which amplifies the photocurrent differential signal and converts it into a voltage signal.

A reference signal generated via the reference detector may be used for controlling the intensity of the employed light source.

It is furthermore possible that the detector system includes two reference detectors, and the generated reference signal from a reference detector is used for controlling the intensity of the used light source.

One especially advantageous feature of the device described herein is that a varying luminous power no longer has a negative effect on the output signal even if the temperatures are fluctuating, i.e., a faultless ascertainment of the vibrational amplitude is ensured even at fluctuating temperatures.

In addition, the generated output signal includes only a slight noise component. This makes it possible to metrologically record not only the fundamental wave of the ultrasonic movement of the capillary tube but also its harmonic waves having correspondingly smaller vibrational amplitudes. Such harmonic waves are very sensitive with regard to the mechanical connection of the capillary tube, so that important information is able to be obtained if the phase and amplitude of the harmonic waves are known.

Further details and advantages of example embodiments of the present invention are explained with reference to the Figures.

DETAILED DESCRIPTION

Figure 2:
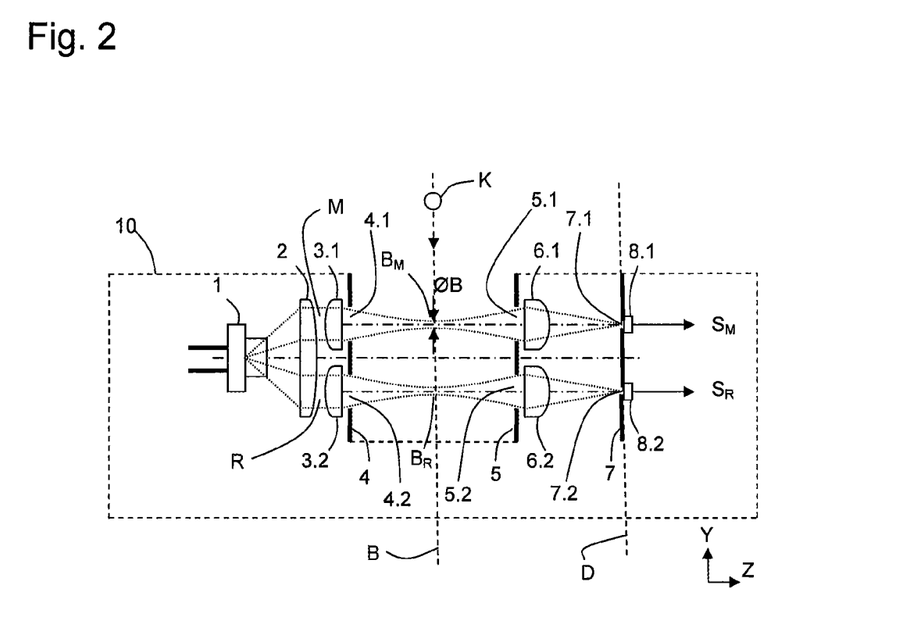
FIG. 2 schematically illustrates a device according to an example embodiment of the present invention.

A device for measuring the vibrational amplitude of a capillary tube of a wire bonder according to an example embodiment of the present invention will be discussed in the following text with reference to FIGS. 2-5. While FIG. 2 shows a schematic view of a device according to an example embodiment of the present invention, a detailed description of the method of functioning of this exemplary embodiment is provided by the views of the capillary tube and the measuring beam of light in FIG. 3, the wiring diagram in FIG. 4, and the different illustrated signal curves in FIG. 5.

Figure 3:
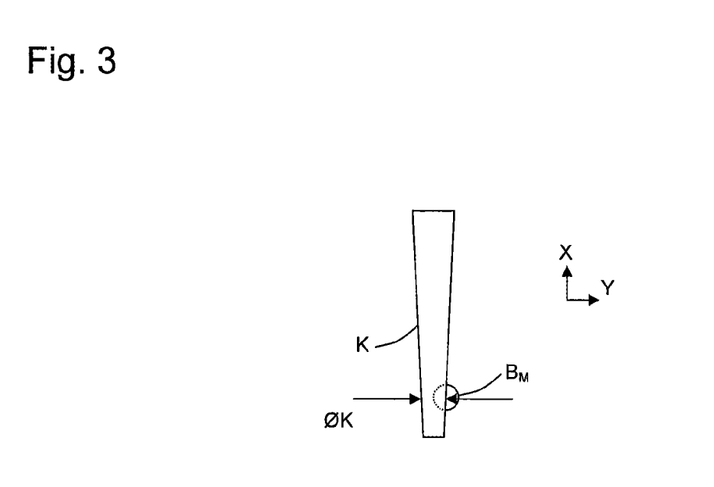
FIG. 3 illustrates the capillary tube and the partially shaded measuring beam of light in the exemplary embodiment illustrated in FIG. 2.

In the illustrated exemplary embodiment of device 10, a light source 1, for instance arranged as an LED, is provided, which emits a beam of light which is collimated via a collimation lens 2 and then split into a measuring beam of light M and a reference beam of light R. For such splitting, a first imaging optics having two lenses 3.1, 3.2 is placed in the collimated beam of light, one lens 3.1 being allocated to measuring beam of light M and the other lens 3.2 being allocated to reference beam of light R. Lenses 3.1, 3.2 may be arranged both as refractive lenses and diffractive lenses, which are suitably situated in measuring beam of light M and in reference beam of light R. Via the first imaging optics or lenses 3.1, 3.2, imaging of light source 1 into an image plane B, in which light source images $B_M$ or $B_R$ are generated, takes place in respective beams of lights M, R in each case. In the exemplary embodiment illustrated, a diaphragm 4 having two diaphragm apertures 4.1, 4.2 that are disposed downstream from lenses 3.1, 3.2 in light propagation direction Z, is part of the first imaging optics as well. Here, image plane B also constitutes the plane in which capillary tube K is vibrating in the indicated Y direction. In FIGS. 1 through 3, image plane B thus represents the XY plane, X denoting the longitudinal extension direction of the capillary tube. As illustrated in FIG. 2, capillary tube K at least partially shades only measuring bundle of light M in the vibrating state, while the optical path of reference beam of light R is not shaded by capillary tube K. An imaging scale m according to m=1 may be selected for the imaging that takes place via lenses 3.1, 3.2 of the first imaging optics, but it is alternatively also possible to choose m<1.

Behind image plane B, measuring beam of light M and reference beam of light R then propagate in the direction of a second imaging optics, which includes, in sequential order, in the individual optical paths a diaphragm 5 having two diaphragm apertures 5.1, 5.2 as well as two lenses 6.1, 6.2 in beam propagation direction Z. With the aid of the second imaging optics or lenses 6.1, 6.2, measuring beam of light M and reference beam of light R are then focused into a detection plane D, in which a further diaphragm 7 having diaphragm apertures 7.1, 7.2 is disposed in the two beams of light M, R. Measuring detector 8.1 is situated immediately adjacent to and downstream from diaphragm aperture 7.1 in measuring beam of light M, and reference detector 8.2 of the detector system is disposed immediately adjacent to and downstream from diaphragm aperture 7.2 in reference beam of light R. A signal, hereinafter designated as output signal $S_M$ or measuring signal, results via measuring detector 8.1, and output signal SR is obtained at the output of reference detector 8.2, the latter also being referred to as reference signal in the following text.

For measuring the vibrational amplitude with the aid of device 10, a sliding unit is employed to bring capillary tube K into the vicinity of the location of light source image $B_M$ in measuring beam of light M, this location also being referred to as sampling point in the following text. Capillary tube K is moved into measuring beam of light M in the Y direction to such a depth that it is covered approximately halfway, as illustrated in FIG. 3. It may be provided that diameter ØB of light source image $B_M$ is less than two times the diameter 2ØK of capillary tube K at the sampling point, in order to allow capillary tube K to half mask or shade measuring beam of light M.

Figure 5:
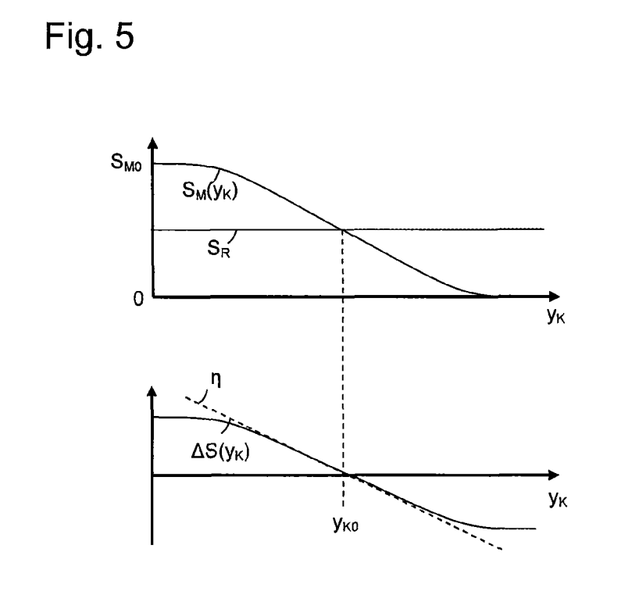
FIG. 5 illustrates the characteristic of different signals in the exemplary embodiment illustrated in FIG. 2.

Output signal $S_M(y_K)$, shown in the upper portion of FIG. 5, which results at measuring detector 8.1 and is a function of position $y_K$ of capillary tube K, also drops to one half of the output value $S_{M0}$ at this location. Hereinafter, this position will be referred to as nominal measuring position $y_{K0}$. The sliding device is stopped at this location. Output signal $S_R$ of reference detector R is unaffected by the vibratory motion of capillary tube K and remains constant at a certain signal level. In the exemplary embodiment illustrated, constant output signal $S_R$ of reference detector 8.2 preferably is set such that reference signal $S_R$ is roughly one half the size of output value $S_{M0}$ of output signal $S_M(y_K)$ of measuring detector 8.1, that is:

$$S_R = S_{M0}/2 \tag{Eq. 2}$$

where:
$S_R$:=the output signal of the reference detector
$S_{M0}$:=the output value of the output signal of the measuring detector.

As illustrated in the upper signal representation in FIG. 5, output signals $S_M$, $S_R$ of measuring detector 8.1 and reference detector 8.2 are of equal magnitude at nominal measuring position $y_{K0}$.

Figure 4:
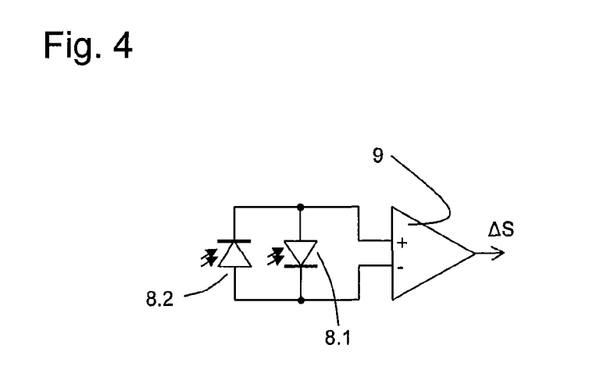
FIG. 4 schematically illustrates signal processing in the exemplary embodiment illustrated in FIG. 2.

With regard to the further signal processing in the current exemplary embodiment, reference is made to FIG. 4 and to the signal illustrations in FIG. 5. As shown in FIG. 4, the photoelement of measuring detector 8.1 and the photoelement of reference detector 8.2 are interconnected in an antiparallel manner, so that a photocurrent differential signal $S_M - S_R$ results at the two output-side terminals of the illustrated circuit configuration. Photocurrent differential signal $S_M - S_R$ generated in this manner is then amplified via a downstream transimpedance amplification stage 9 and converted into a voltage signal ΔS. The lower portion of FIG. 5 illustrates the characteristic of voltage signal ΔS in the region of nominal measuring position $y_{K0}$. At nominal measuring position $y_{K0}$ the value of voltage signal ΔS is zero, which means that $\Delta S(y_{k0})=0$ applies.

If the piezo actuator in the wire bonder is switched on in order to generate the ultrasonic wave, voltage signal ΔS modulates around the signal level of zero at a slope factor η according to the initially mentioned equation (1).

Based on the interconnected output signals $S_M$, $S_R$ of measuring detector 8.1 and reference detector 8.2, it is thereby possible to ascertain the vibrational amplitude of capillary tube K in a reliable manner.

A number of advantages are derived from the approach described herein. For example, transimpedance amplification stage 9 may be configured such that only small current signals around zero must be processed without offset. This makes it possible to select a considerably higher amplification factor of transimpedance amplification stage 9, which results in an especially high slope factor η and particularly low noise. In principle, the amplification factor may be selected of such a magnitude that transimpedance amplification stage 9 assumes a saturated state already when no capillary tube K dips into the optical path of measuring beam of light M or when capillary tube K completely blocks measuring beam of light M. Furthermore, output signal ΔS is not adversely affected by the unavoidable drift of high offset values, as they occur in the conventional systems discussed above. Both effects allow a much higher reproducibility of the vibration measurements with the aid of the device described herein.

Advantages in connection with the device described herein are obtained even if the temperature of the wire bonder changes. The changed luminous power of the light source that results in response to temperature changes now no longer leads to a signal offset, and thus to a different nominal measuring position $y_{K0}$ that would adversely affect the reproducibility of the measurement. However, it is unavoidable that slope factor η will be modified along with the luminous power in response to a temperature change. It is therefore advantageous to control the luminous power of the light source with the aid of output signal $S_R$ of the reference detector. Such a control will be described in the following text with the aid of a second exemplary embodiment of the device.

Of importance for the various advantages of the device hereof is that proposed reference signal $S_R$ not be generated electrically but optically, i.e., by detecting reference beam of light R, which comes from the same light source as measuring beam of light M. Here, it is advantageous to generate reference beam of light R in the most symmetrical fashion possible with respect to measuring beam of light M. Possible fault influences, such as the drift of components, may then have a largely similar effect on the two output signals $S_M$, $S_R$ of measuring and reference detectors 8.1, 8.2 and compensate in the subtraction.

Another noteworthy advantage is that stray light which causes errors is able to be suppressed in this manner. For example, it may be provided that diaphragm apertures 7.1, 7.2 of diaphragm 7 have a diameter in detection plane D that is approximately in the range of two to three times the diameter of focused beams of light M, R. In addition, diaphragm apertures 7.1, 7.2 are arranged in the focal plane of lenses 6.1, 6.2 of the second imaging optics. Furthermore, in the YZ plane, diaphragm apertures 7.1, 7.2 are centrically situated upstream from measuring detector 8.1 or reference detector 8.2 disposed directly downstream therefrom. Together with diaphragm apertures 5.1, 5.2 of diaphragm 5, it is ensured that only light whose propagation direction is arranged within the aperture angles of individual lenses 6.1, 6.2 actually reaches associated detectors 8.1, 8.2. This guarantees that stray light which impinges under greater angles than those specified by the detector-side measuring and reference apertures, does not reach measuring detector 8.1 or reference detector 8.2.

Figure 6:
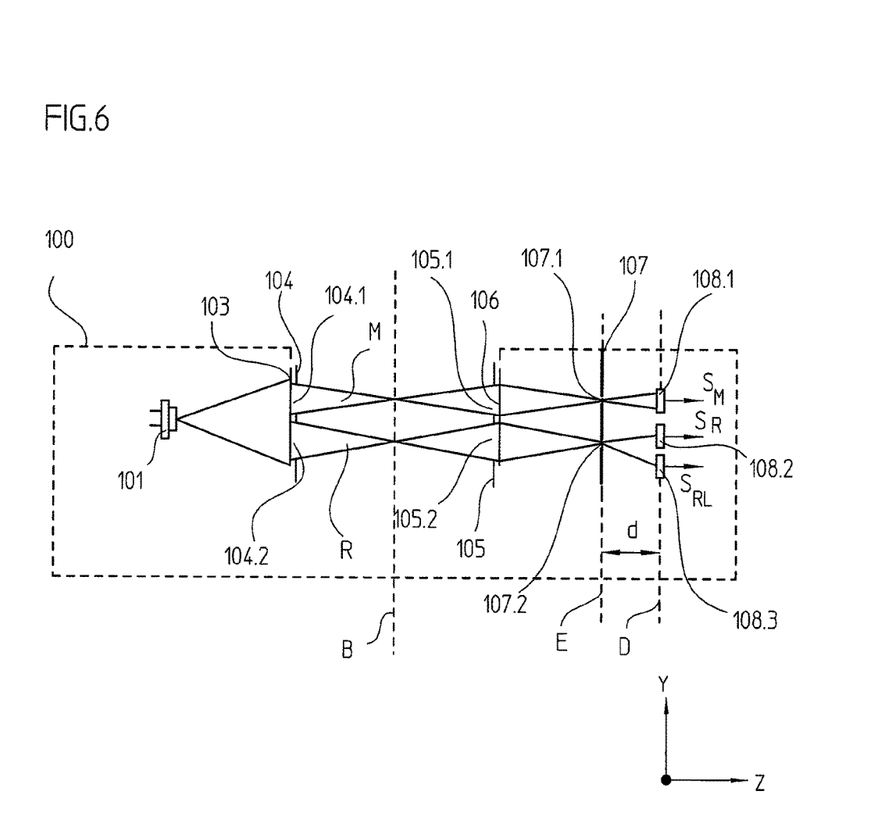
FIG. 6 schematically illustrates a device according to an example embodiment of the present invention.

A position-measuring device 100 according to an example embodiment of the present invention is explained below with reference to FIGS. 6 and 7. In principle, only the important differences from the previously discussed exemplary embodiment will be addressed. FIG. 6 once again shows a schematic illustration thereof, and FIG. 7 illustrates the signal processing used for controlling the light source intensity in this case.

Similar to the above example, imaging of the light source in measuring beam of light M and in reference beam of light R into image plane B takes place via first imaging optics 103 and diaphragm 104. Here, too, the capillary tube vibrates in image plane B and at least partially shades measuring beam of light M in so doing. Via diaphragm 105 and second imaging optics 106, the light source images from image plane B are finally imaged into diaphragm plane E with the two diaphragm apertures 107.1, 107.2; situated downstream, at distance d, are measuring detector 108.1 and the two reference detectors 108.2, 108.3. First and second imaging optics 103, 106 are arranged as 4-stage diffractive lenses in each case. The two schematically illustrated diaphragms 104, 105 are arranged as absorbent thin layers on backing glass, on which the diffractive lenses of first and second imaging optics 103, 106 are situated as well, the thin layers enclosing the diffractive lenses of first and second imaging optics 103, 106 in each case.

In contrast to the previous exemplary embodiment, reference beam of light R is detected on the detection side via two reference detectors 108.2, 108.3. First reference detector 108.2 supplies reference signal $S_R$, which is utilized, as above, for generating photocurrent differential signal $S_M-S_R$. By splitting reference beam of light R, it is possible to comply with the above condition according to equation 2. Second reference detector 108.3 supplies a second reference signal $S_{RL}$, which is used for the previously mentioned control of the intensity of the employed light source 101 and thereby maintains slope factor η constant when temperature changes arise.

Figure 7:
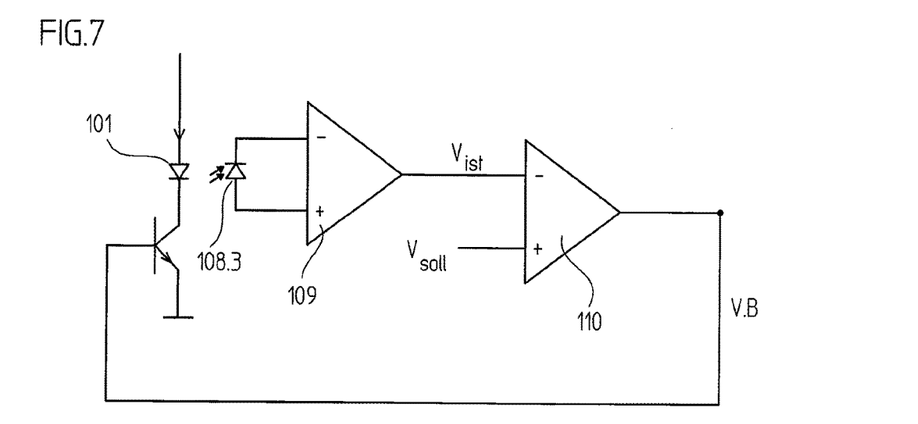
FIG. 7 schematically illustrates signal processing for controlling the light source intensity in the exemplary embodiment illustrated in FIG. 6.

With regard to such a control of the light source, reference is made to FIG. 7, which illustrates the provided signal processing by way of example. Situated downstream from second reference detector 108.3 is a steady light amplifier 109 and, downstream from that, another control amplifier 110 and a control transistor 111. The control maintains the direct current at the inputs of steady light amplifier 109 constant, and thereby compensates for changes in the signals acquired at measuring detector 108.1 that may arise, for example, as a result of aging of light source 101 and detectors 108.1-108.3, the temperature-dependent detector sensitivity or due to a temperature-related change in the luminosity of the light source. On the input side of downstream control amplifier 110, a predefined signal setpoint value $V_{SOLL}$ is applied as well as output signal $V_{IST}$ of steady light amplifier 109, which are compared via control amplifier 110. Output voltage V.B of control amplifier 110 is connected to the base of the external control transistor, which sets the light source current.

Modifications to the exemplary embodiments discussed herein are possible.

For example, instead of the described control of the luminous power of the light source according to the second exemplary embodiment, there is the alternative of using output signal $S_{RL}$ of second reference detector 108.3 for calculating the quotient $(S_M-S_R)/S_{RL}$ from signals $S_M$, $S_R$, $S_{RL}$ in an alternative evaluation electronics. When the luminous power of the light source increases, signals $S_M-S_R$ and $S_{RL}$ increase or decrease by the same factor, so that the quotient calculation supplies a signal $(S_M-S_R)/S_{RL}$ that is independent of the luminous power or the temperature.

Furthermore, there are of course circuit systems other than those illustrated in FIG. 4 for generating differential currents, which are forwarded to a transimpedance amplifier.

Instead of LEDs, it is also possible to use laser diodes as light sources, especially when very small capillary tubes are used in the wire bonder.

Apart from single-stage imaging of the light source into the image plane, double-stage or multi-stage imaging may be provided as well; this may be done using imaging factor m=1 or else using imaging factors m<1.

Instead of using two reference detectors as in the second exemplary embodiment, it is furthermore also possible to use the output signal generated by only one reference detector for controlling the intensity of the employed light source, etc.

What is claimed is:

1. A device for measuring a vibrational amplitude of a capillary tube of a wire bonder, comprising:
   a light source adapted to emit a beam of light;
   a first imaging optic systems located downstream from the light source in a light propagation direction;
   a second imaging optic system; and
   a detector system adapted to ascertain the vibrational amplitude of the capillary tube placed between the light source and the detector system from the shading of the beam of light by the capillary tube;
   wherein the beam of light emitted by the light source is split into a measuring beam of light and a reference beam of light, an edge of the capillary tube at least partially shading the measuring beam of light in a vibrating state, while the reference beam of light is not shaded;
   wherein the detector system includes a measuring detector assigned to the measuring beam of light and at least one reference detector assigned to the reference beam of light, the measuring detector and the reference detector being connected to each other, the vibrational amplitude of the capillary tube being ascertainable from output signals of the measuring detector and the reference detector;
   wherein the first imaging optic system is adapted to image the light source in the measuring beam of light and in the reference beam of light into an image plane in which the capillary tube vibrates;
   wherein the second imaging optic system is located between the image plane and the detector system, the second imaging optic system adapted to focus the measuring beam of light and the reference beam of light into a detection plane and/or into a diaphragm plane; and wherein, adjacent to the detection plane or in the diaphragm plane:
(a) a first diaphragm aperture is located in the measuring beam of light, the measuring detector being located downstream from the first diaphragm aperture in the light propagation direction; and
(b) a second diaphragm aperture is located in the reference beam of light, the reference detector being located downstream from the second diaphragm aperture in the light propagation direction.

2. The device according to claim 1, wherein the first imaging optic system includes refractive and/or diffractive lenses arranged in the measuring beam of light and in the reference beam of light.

3. The device according to claim 1, wherein the first imaging optic system and/or the second imaging optic system includes refractive and/or diffractive lenses arranged in the measuring beam of light and in the reference beam of light.

4. The device according to claim 1, wherein the first imaging optic system is arranged such that a diameter of a light source image in the image plane is less than twice a diameter of the capillary tube.

5. The device according to claim 1, wherein each diaphragm aperture has a diameter that is one to three times a diameter of the focused measuring and reference beams of light.

6. The device according to claim 1, wherein the measuring detector and at least one reference detector are connected to each other in an antiparallel manner, so that a photocurrent differential signal results at output-side connections, the photocurrent differential signal being suppliable to a downstream transimpedance amplification stage adapted to amplifies the photocurrent differential signal and to convert the photocurrent differential signal into a voltage signal.

7. The device according to claim 1, wherein the reference detector is adapted to generate a reference signal for controlling intensity of the light source.

8. The device according to claim 1, wherein the detector system includes two reference detectors, at least one of the reference detectors being adapted to generate a reference signal for controlling intensity of the light source.

* * * * *